United States Patent [19]

Tuppen et al.

[11] Patent Number: 5,122,393
[45] Date of Patent: Jun. 16, 1992

[54] REAGENT SOURCE FOR MOLECULAR BEAM EPITAXY

[75] Inventors: Christopher G. Tuppen, Colchester; David A. Andrews, Woodbridge, both of England

[73] Assignee: British Telecommunications public limited company, London, United Kingdom

[21] Appl. No.: 178,947

[22] Filed: Apr. 7, 1988

[30] Foreign Application Priority Data

Apr. 8, 1987 [GB] United Kingdom ................ 8708436

[51] Int. Cl.⁵ .............................................. C23C 16/00
[52] U.S. Cl. ........................... 427/255.2; 118/715; 118/726; 156/611; 156/DIG. 103
[58] Field of Search ................ 118/726, 719, 715; 261/DIG. 65; 156/611, DIG. 103; 148/DIG. 169; 427/255.2

[56] References Cited

U.S. PATENT DOCUMENTS

| | | | |
|---|---|---|---|
| 4,393,013 | 7/1983 | McMenamin | 261/DIG. 65 |
| 4,545,801 | 10/1985 | Miyajiri et al. | 118/726 |
| 4,550,411 | 10/1985 | Stonestreet et al. | 373/134 |
| 4,636,268 | 1/1987 | Tsang | 156/611 |
| 4,699,085 | 10/1987 | Purdes | 118/719 |
| 4,704,988 | 11/1987 | Mellet | 118/726 |
| 4,774,416 | 9/1988 | Askary et al. | 250/492.2 |

FOREIGN PATENT DOCUMENTS

| | | | |
|---|---|---|---|
| 18068 | 10/1980 | European Pat. Off. | |
| 193419 | 9/1986 | European Pat. Off. | |
| 196170 | 10/1986 | European Pat. Off. | |
| 60-42813 | 3/1985 | Japan | 156/611 |
| 61-94319 | 5/1986 | Japan | 118/715 |
| 61-187226 | 8/1986 | Japan | 118/715 |
| 61-187229 | 8/1986 | Japan | 118/715 |
| 2062013A | 5/1981 | United Kingdom | 118/726 |
| 2156857A | 10/1985 | United Kingdom | |

Primary Examiner—Michael Lusignan
Assistant Examiner—Terry J. Owens
Attorney, Agent, or Firm—Nixon & Vanderhye

[57] ABSTRACT

A source assembly adapted to provide one or more metal organic compounds into an MBE reaction chamber wherein the source assembly comprises a mixer manifold which has one or more inlet connectors for providing the metal organic compounds. Each inlet connector includes a resistance valve for defining a flow rate of vapour of the metal organic compound under a pre-set pressure gradient and an on/off valve for selecting the operational status of the source. Preferably the mixer manifold acts as a collimator which avoids the need to fit a rotating substrate.

16 Claims, 4 Drawing Sheets

REAGENT SOURCE FOR MOLECULAR BEAM EPITAXY

FIELD OF THE INVENTION

This invention relates to a reagent source for molecular beam epitaxy, often known as "MBE".

BACKGROUND AND SUMMARY OF THE INVENTION

MBE is a well known process which is used to produce semiconductor devices, e.g. devices for optical telecommunications such as lasers, detectors and optical amplifiers.

The MBE process comprises projecting a molecular beam of reactant species at the surface of a substrate. The process is carried out at low pressure such that the length of the beam is considerably less than the mean free path of the molecules. Under these conditions there are no collisions in the beam and hence all the reaction takes place on the surface of the substrate. The very low pressure at which MBE operates will sometimes be called "vacuum".

MBE is used to deposit many different compound chemical species, comprised of many elements from many of the groups in the periodic table. One important application is the use of MBE to produce semiconductor devices made of compounds formed from a combination of elements from groups III and V of the periodic table. Examples of III/V compound semiconductors produced by MBE include GaAs, InP and AlAs with dopants such as Be and Si.

Most existing MBE systems evaporate the required components of a deposited layer from individual thermal evaporation cells containing the material in elemental form. These are effective, but have a number of disadvantages. For example, they need constant calibration and "spitting" from the cells gives rise to morphological defects in the deposited layers. A further problem is that effusion cells have a finite lifetime before they need refilling. This involves venting the MBE system to atmosphere which is time consuming and has deleterious effects on system calibration and layer morphology. Many of these problems have recently been alleviated by the replacement of the effusion cells with gas sources. One of the main advantages with gas sources is that they can be replenished without the need to vent the main system. Thus the group V elements are introduced to the MBE system as the gaseous hydrides (e.g. $AsH_3$ and $PH_3$), using a specially designed gas handling system, and the group III and dopant elements as metal organic compounds (MOC's), e.g. $In(CH_3)_3$, $Ga(C_2H_5)_3$ and $Al(CH_3)_3$ plus $Be(C_2H_5)_2$ and $Si(C_2H_5)_4$ for dopants.

The MOC's are all volatile liquids or solids which have been widely used in other epitaxial processes, e.g. metal organic chemical vapour deposition. Thus equipment to handle these compounds is already available, e.g. flasks which include stopper-valves and connectors for attaching valves to growth apparatus.

Proposed methods of using metal organic compounds have not been entirely satisfactory for MBE. For example mass flow controllers do not work well at the low flow rates needed for MBE. In addition the mass flow controllers must be situated outside the reaction chamber and this gives rise to difficulties.

Direct evaporation into an antechamber has also been proposed. The antechamber is connected to the reaction chamber via a capilliary tube which is provided with an on/off valve to switch reactant between layers.

The necessary control has included a feedback loop to stabilise the pressure in the antechamber. Although this method works it is complex and has slow switching times.

Thus the problem exists of obtaining a beam with better uniformity than the beam provided by effusion cells with a source that provides fast switching times.

This invention proposes a solution in which the saturated vapour of a metal organic compound passes into a mixer manifold via an on/off control valve and a resistance valve. The mixer manifold is effectively part of the MBE reaction chamber. In preferred embodiments the mixer manifold produces a uniform beam and this may obviate the need for a rotating substrate.

The high resistance valve constitutes the interface between the vacuum part of the reactor and the reservoir flask which holds the reserve of metal organics. The flow rate is determined by the pressure drop across the resistance which is substantially constant. Since the low pressure is substantially zero the high pressure constitutes the primary control. Maintaining a liquid metal organic compound in thermal equilibrium with its vapour constitutes an effective way of adjusting this primary control.

As stated above, the mixer manifold gives rise to a uniform beam which is partially collimated. It should be noted that a collimating manifold can be used with sources other than the combinations of resistance valve-/on-off valve and thermostat mentioned above. The collimating manifold can also be used with mass flow controllers, pressure regulated sources and low pressure vapour source mass flow controllers.

The collimating manifold comprises:
 (i) An exit port adapted for connection to supply a collimated beam to an MBE reactant chamber;
 (ii) A reception zone wherein inlet ports for the admission of reagents are located; and
 (iii) An elongate collimation zone situated between the reception zone and the exit port.

The collimation zone has two important functions, namely to produce a beam which is sufficiently uniform in respect of both composition and flux. This is facilitated when the ratio:

$$R = \frac{(LENGTH)^3}{VOLUME}$$

is greater than 10, preferably greater than 50.

It will be apparent that the cross sectional area of the beam should be large enough for the beam to cover the whole of the substrate. The substrate is often circular and, therefore, a collimation zone with a circular cross section is appropriate.

In addition to uniformity, it is also important to achieve rapid switching in order to grow a device with layers having sharp interfaces. This requires that, when "switching off", molecules which remain in the collimation zone dissipate rapidly and, therefore, a low flow resistance, e.g. with no small dimensions, is appropriate. It has already been mentioned that a circular cross section is appropriate and this configuration is also suitable to give a low flow resistance.

Thus a cylindrical collimation zone, preferably having an axial length at least three times its diameter, is particularly appropriate.

For use with a substrate having a diameter of 5 cm, a cylindrical collimation zone with a diameter of 6 cm and a length 50 cm would be suitable. For such a collimation zone the parameters quoted above have the following values:

| | |
|---|---|
| LENGTH | 50 cm |
| DIAMETER | 6 cm |
| LENGTH:DIAMETER | 8.3 |
| VOLUME | 1.4 liters |
| R | 88 |

The collimating manifold may also incorporate a secondary source for other reagents, e.g. reagents such as $PH_3$ and $AsH_3$ which require thermal cracking. It may be desirable to release these reagents at the exit port and to locate the thermal cracker at the exit port. The secondary source conveniently takes the form of a supply tube, adapted to convey a mixture of secondary reagents, situated on the axis of the collimation zone. A thermal cracker is included as part of the secondary source.

BRIEF DESCRIPTION OF THE DRAWINGS

The invention will now be described by way of example with reference to the accompanying drawings in which.

DETAILED DESCRIPTION OF THE DRAWINGS

Figure 1:
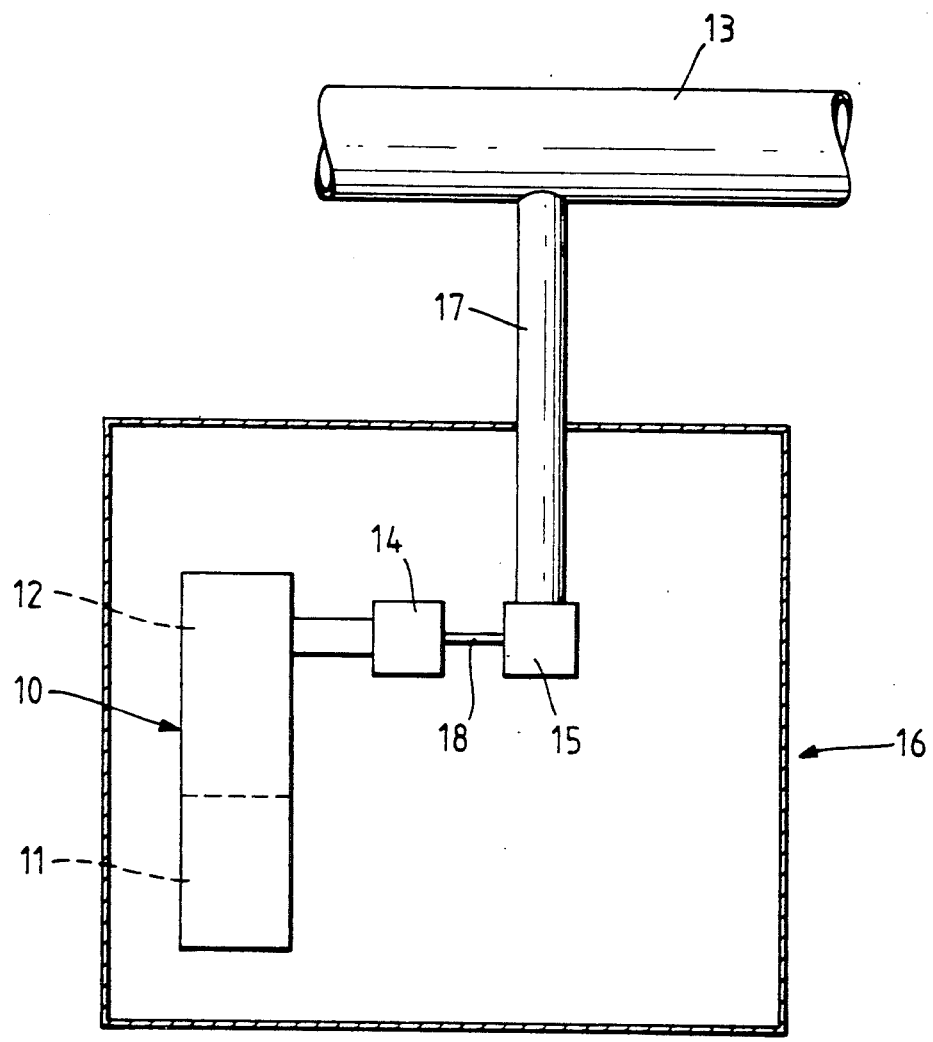
FIG. 1 is a diagrammatic representation of a primary source.

The primary source shown in FIG. 1 comprises a flask 10 for containing liquid or solid metal organic compound 11 (MOC) in equilibrium with its saturated vapour 12. The vapour space of the flask 10 is connected to a mixer manifold 13 which is effectively part of an MBE reaction chamber (not shown) via a remote control on/off valve 14 and a pre-set high resistance valve 15. The flask 11 and valves 14, 15 are located in a thermostatically controlled environment 16 (the operational parts of the thermostat are not shown). The high resistance valve 15 is connected to the mixer manifold 13 by means of wide bore connector 17.

In use, the thermostat 16 attains its controlled operating temperature whereby the vapour 12 achieves a saturated pressure corresponding to the controlled temperature. The mixer manifold 13 is evacuated to the very low pressure utilized for MBE and connector 17 is at this same pressure. Thus, valve 14 being "on", resistance valve 15 has its inlet side subjected to the vapour pressure of the MOC and its outlet side to vacuum. Therefore the MOC vapour flows into mixer manifold 13 at a rate determined by the resistance of valve 15 and the vapour pressure in flask 10.

The process is controlled by keeping the resistance of valve 15 constant from run to run, i.e. over a long period of time, and adjusting the set-point of thermostat 16 as appropriate. A higher set point increases the vapour pressure of the MOC whereby its feed rate to the MBE process is increased. Similarly a lower set point reduces the vapour pressure whereby the feed rate is reduced.

As is conventional for MBE, the process control needs to be calibrated by careful quality control and growing special test pieces as necessary.

Thus careful quality control informs operators of any errors in the supply rate of the MOC and such errors are removed by compensating adjustments of the set point of thermostat 16. This control strategy depends on the assumption that the resistance of valve 15 is constant and this assumption is good enough for the calibration mentioned above to give acceptable results.

Although adjustment of valve 15 is not utilized in process control, it is desirable that the resistance of the valve 15 be adjustable so that it can be pre-set to a suitable value. Once pre-set the valve 15 should remain in adjustment for many production runs, i.e. over long periods of time, e.g. weeks or months.

The main purpose of the pre-setting of valve 15 is to provide a convenient set point for thermostat 16, e.g. about 5° C. to 20° C. above ambient temperature. It will be apparent that the selected value of the resistance is related to both the volatility of the MOC in question and its intended feed rate. Thus dopants, such as $Be(C_2H_5)_2$ and $Si(C_2H_5)_4$, which are used at very low feed rates, require much higher resistances than major reactants such as $In(CH_3)_3$, $Ga(C_2H_5)_3$ and $Al(CH_3)_3$. Similarly, and for similar intended flow rates, a more volatile MOC will require a higher resistance than a less volatile MOC.

The space 18 between valves 14 and 15 does not have any noticeable effect during the use of flask 10. When the valve 14 is "off" space 18 is under MBE vacuum and, when valve 14 opens (to begin growth of a new layer) it rapidly pressurises to the vapour pressure of MOC in vapour space 12. Thus normal flow through valve 15 is established substantially at once. There is a short time gap for molecules to traverse the whole path system and impinge on the substrate but the "on" transition is sharp because the space 18 fills rapidly.

When valve 14 closes (at the end of the growth of a layer) the space 18 remains full of MOC vapour. Even though the space is relatively small its residual vapour could represent a high proportion of the whole amount in the system because of the relative pressures. The residual vapour may take a substantial time to percolate through resistance valve 15 and thereby reduce the sharpness of the interface. To prevent this undesirable effect the following are recommended:

(1) Keep space 18 as small as possible; or
(2) Combine valves 14 and 15 into a single on/off unit in which the "on" state produces the correct (adjustable) resistance; and/or
(3) Provide vents as described further below, e.g. vent the connector 17.

Features not shown in the drawings will now be mentioned.

If MOC condenses in the space 18, in the valve 15 or in the connector 17 an external electrical heating element will prevent this.

Flask 11 has a conventional closure valve to permit removal of the flask for replenishing. The removal is, of course, caried out with valve 14 "off" to prevent access of air to the MBE reaction chamber. The closure valve prevents loss of MOC from the flask and access of air to vapour space 12 while the flask is in transit. (If any air is trapped when the flask 11 is re-attached the volume is so low that it can be removed via manifold 13 or via vents in connector 17).

Figure 2:
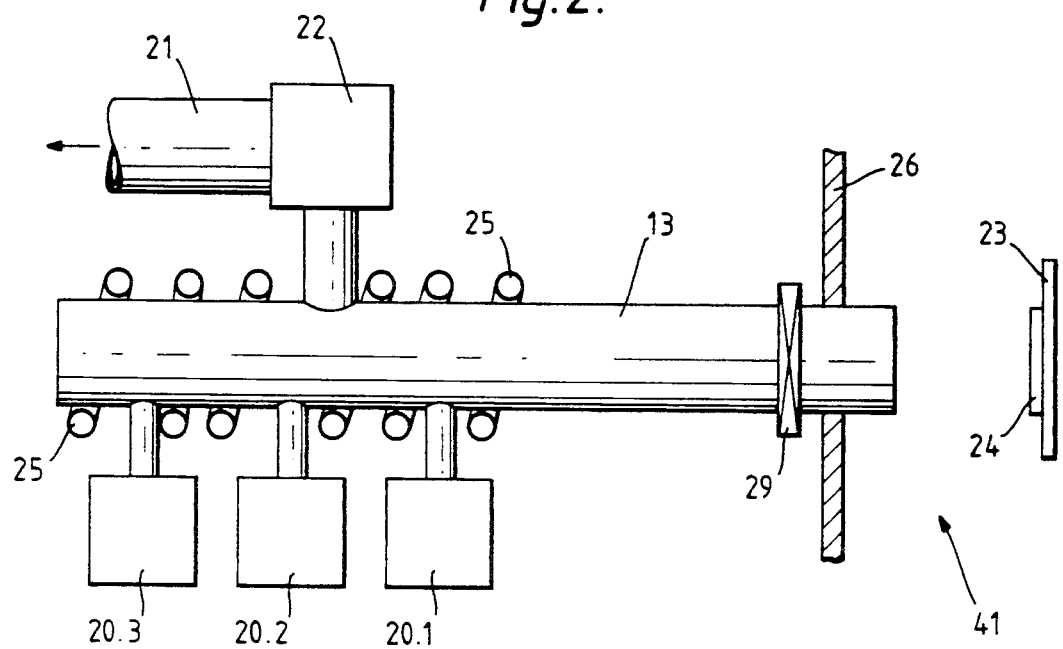
FIG. 2 is a diagrammatic representation of a multiple source which incorporates a plurality of primary sources as shown in FIG. 1.

The MBE system shown diagrammatically in FIG. 2 comprises a substrate 24 mounted on a heater 23. The substrate is located in an MBE chamber having a wall 26. The mixer manifold 13, which passes through the wall 26, has substantially the same diameter as the substrate which is located on an extension of the axis of the mixer manifold.

The manifold 13 is connected to MBE vacuum by means of a high conductance valve 29. The manifold can also be connected to a separate vent line 21 via the valve 22. Valves 29 and 22 are connected such that when one is closed the other is open and vice versa. This system allows residual gas trapped in volume 18 to be vented and for gas flows to be set up prior to connection to the main MBE system. This produces sharper interfaces and prevents unwanted transients when MOC flows are initiated. The manifold 13 is surrounded by a heater 25 to keep the wall at a temperature above the volatilisation temperature of the reagents so as to reduce absorption onto the wall (and to bake off adsorption should it occur).

The mixer manifold 13 has a succession of sources 20.1, 20.2, 20.3. (Only three are shown but more can be provided if desired). Each source is as shown in FIG. 1. Each source 20 operates as described above and is independently adjustable.

The various MOC's, which are independently supplied to mixer manifold 13, give rise to a uniformly distributed mixture in the manifold 13. Furthermore, the beam remains uniform (with the possible exception of a non-typical periphery) until it reaches the substrate 24. The uniform beam gives rise to uniform coatings and, depending on the design of the other sources in the MBE system, may obviate the need to rotate the substrate. Thus the equipment needed to rotate the substrate could be eliminated which is a substantial benefit.

A series of layers (which is the usual requirement) is grown by actuating the on/off valves 14 and the vent-/run valves 22 and 29 at the appropriate times. As explained above, the switching is "sharp". As all time lags are short and of similar duration for all sources 20, simultaneous switching of all sources 20 produces a sharp interface at substrate 24.

Adjustment of the thermostat set points in accordance with quality control information enables accurate control of reactant ratios.

Figure 3:
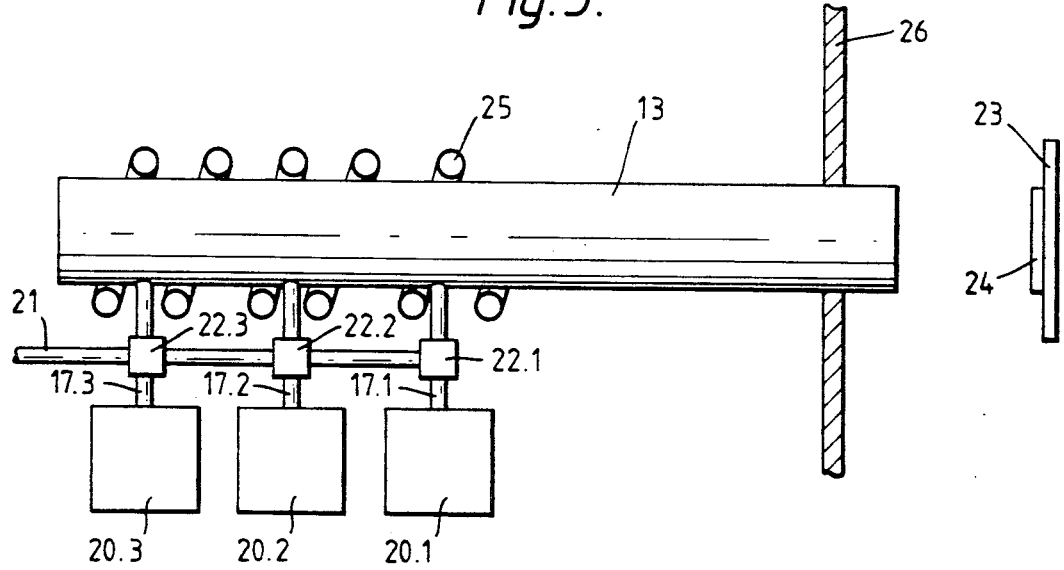
FIG. 3 is a modification of FIG. 2.

FIG. 3 is a modification of FIG. 2 in which a single vent control valve 22 for venting the mixer manifold 13 is replaced by a plurality of vent valves 22.1, 22.2 and 22.3 each of which connects to one of the connectors 17.

The vent valves are arranged such that the MOC source is connected to either the mixing manifold 13 or to the vent line 21. During the growth of a layer the source will be connected to the mixing manifold 13. At the end of the layer deposition the source will be switched to the vent line 21. This allows any MOC trapped in the volume 18 to be vented. The vent line can also be used prior to deposition to set up flows thus preventing unwanted transients. When a particular MOC is required it can then be selected by switching valve 22 from the vent line to the manifold.

Figure 4:
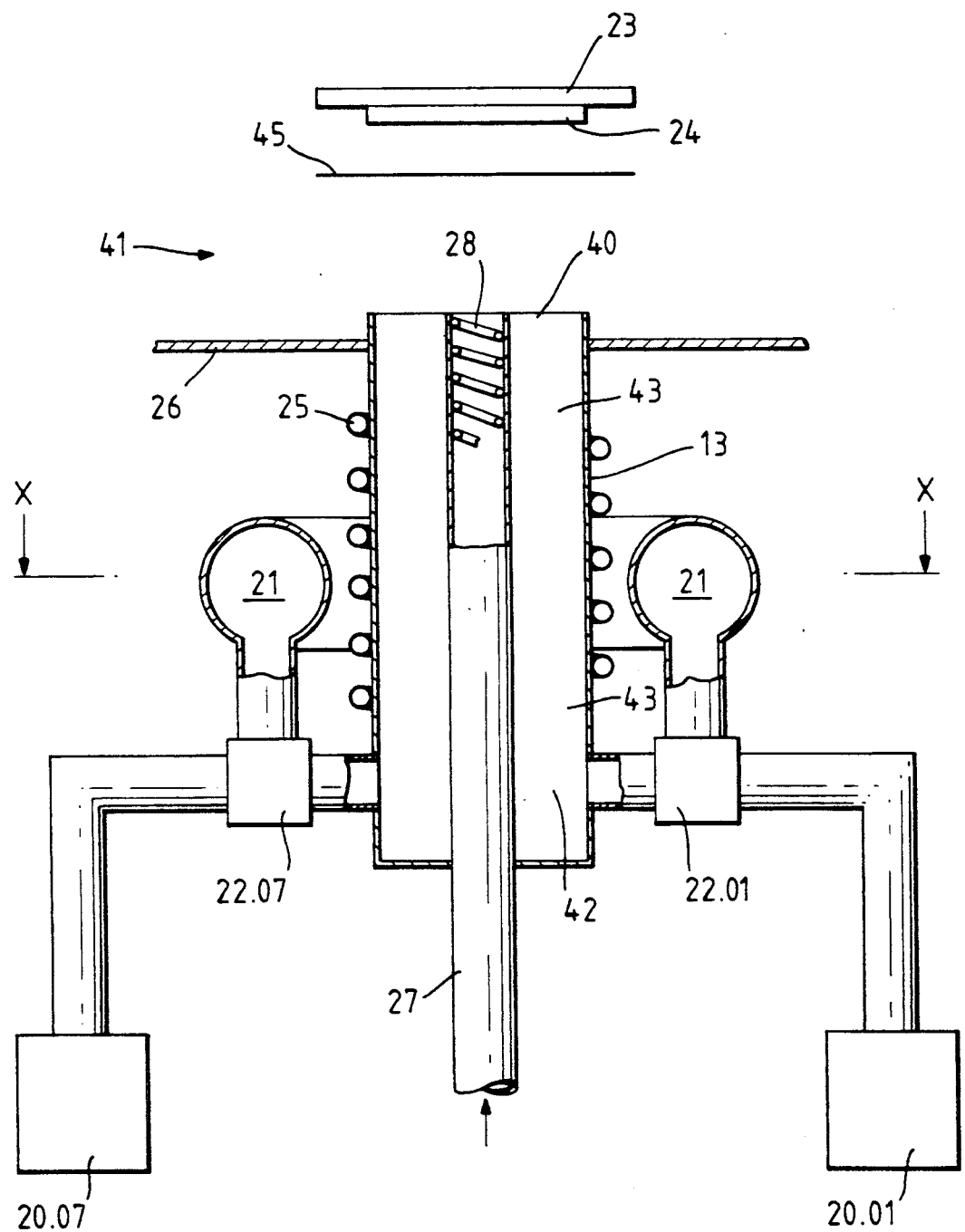
FIG. 4 is a diagrammatic vertical cross section of an MBE apparatus including 12 primary sources as shown in FIG. 1 and arranged to receive gaseous non metals.
Figure 5:
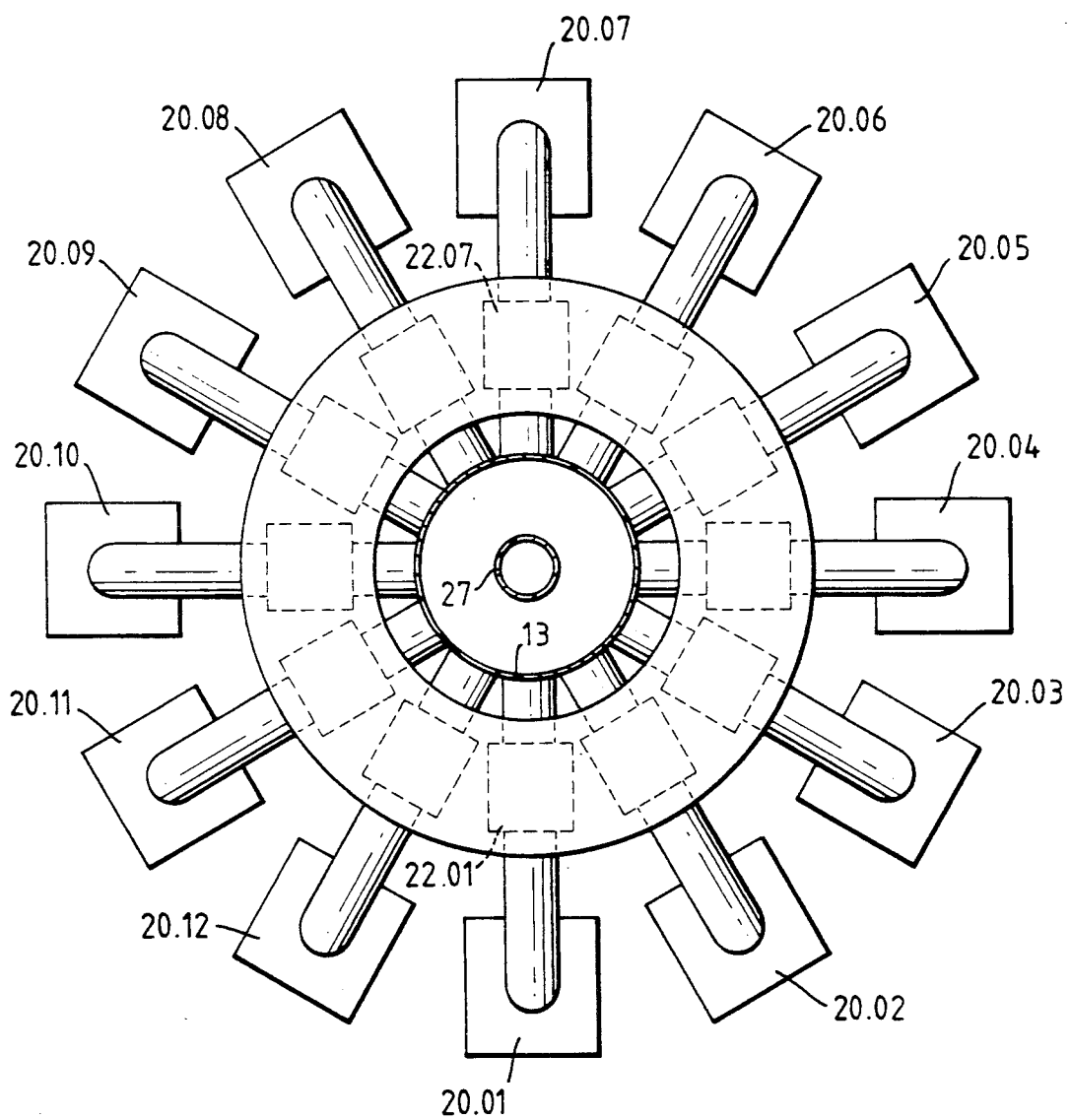
FIG. 5 is a horizontal cross section at level X—X shown in FIG. 4.

FIGS. 4 and 5 show a modification of FIG. 3 in which the axis of the mixer manifold 13 is vertical instead of horizontal. The manifold 13 has an exit port 40 which, in use, supplies a molecular beam into the MBE chamber 41. Item 45 of FIG. 4 is a conventional shutter. There are twelve sources, 20.01-20.12, arranged uniformly around a reception zone 42, i.e. at 30° intervals. All of these sources enter the reception zone 42 substantially normal to the axis of the manifold 13. The reception zone 42 is separated from exit port 40 by a collimating zone 43. Thus all path lengths are similar which improves simultaneity. The MOC part of the system operates as described in FIG. 3.

The manifold 13 has a secondary source in the form of a concentric manifold 27 which receives the gaseous reactants such as $PH_3$ and $AsH_3$. The thermal cracker 28 for the hydrides is located at the top of the concentric manifold 27.

The source shown in FIGS. 3 and 4 can provide all necessary reactants to an MBE process.

The geometric constraints of the circular configuration shown in FIGS. 4 and 5 would permit more than twelve individual sources if needed. The thermal inertia of a source, e.g. flask 10 and its contents, is too high to permit adjustment of the thermostat set points during a run. Therefore, if a reagent is needed at more than one feed rate it is desirable to provide a source for each feed rate.

The concentric manifold 27 should occupy a small proportion of the mixer manifold, e.g. less than 10% of the total cross sectional area. Because it is small, the concentric manifold does not unacceptably reduce the concentration of the MOC's at the centre of the substrate. The hydrides are provided by the concentric manifold in the form of a divergent beam. However, the reaction is conducted with the hydrides in excess and, therefore, satisfactory results are achieved with uniform distribution of metals and non-uniform excess of hydrides. In fact concentric manifold 27 provides a suitable excess of hydride at all parts of the substrate.

It should be noted that the collimating manifold produces a beam which is substantially less divergent than conventional sources (such as concentric manifold 27 and effusion cells). As has already been explained, the important effects of the collimating manifold are:

(i) that it gives a beam of uniform composition across the substrate:

(ii) that it gives a uniform flux across the substrate.

Item (i) is important, especially when growing a non-stoichiometric layer such as an indium gallium phosphide arsenide. In these circumstances the chemical composition of the epitaxial deposit depends on the composition of the molecular beam. Thus the composition of the deposited epitaxial layer would vary from place to place if the beam were not uniform.

Item (ii) is important because the flux, i.e. the total flow rate of all the components of the beam, affects the rate of deposition. For a non-uniform beam some parts of the layer might grow more rapidly than others.

As indicated above, the mixer manifold 13, with the possible exception of a peripheral region, provides adequate uniformity of both composition and flux. The divergence of the beam avoids any "shadow" which might be caused by the concentric manifold 27 which prevents central access of the reactants supplied via sources 20.

All the surfaces of the manifold 13 should be heated to prevent condensation of reactants thereon.

Using techniques described in this specification the following epitaxial layers were grown:

EXAMPLE 1

InP was grown onto In P using $In(CH_3)_3$ and $PH_3$ as reagents.

EXAMPLE 2

$GaInAs_2$ was grown onto In P using $Ga(C_2H_5)_3$ and $In(CH)_3$ as metal organic compounds and $AsH_3$ as the complementary reagent.

EXAMPLE 3

GaAs was grown on Ga As using $Ga(C_2H_5)_3$ and $AsH_3$ as the reagents.

While the invention has been described in connection with what are presently considered to be the most practical and preferred embodiments, it is to be understood that the invention is not to be limited to the disclosed embodiments, but on the contrary, is intended to cover various modifications and equivalent arrangements included within the spirit and scope of the appended claims.

We claim:

1. A source assembly adapted to provide one or more metal organic compounds into an MBE reaction chamber, the source assembly comprising:

a manifold having one or more inlet connectors for providing the metal organic compounds;

each inlet connector including a resistance valve for defining a flow rate of vapour of the metal organic compound under a pre-set pressure gradient and an on/off valve for selecting the operational status of the source, said manifold including an elongate zone connected at its exit to said MBE reaction chamber, said zone being sufficiently long as to provide a collimated, substantially uniform molecular beam to a substrate located in said chamber.

2. A source assembly according to claim 1, wherein the resistance valve and the on/off valve are configured as a single component.

3. A source assembly according to either claim 1 or claim 2, wherein each inlet connector includes a vent valve adapted for connection to the vacuum system of an MBE equipment, said vent valve having a common actuator with the on/off valve, said actuator being such that one valve is "on" and the other valve is "off".

4. A source assembly according to any of claims 1 or 2 which includes a flask containing a volatile liquid or solid organometallic compound, said flask being connected to the manifold via the on/off valve and the resistance valve and located in a thermostat to provide a controlled pressure of the organo-metallic compound.

5. An MBE apparatus having a reagent source according to any one of claims 1 or 2.

6. An MBE apparatus according to claim 5, further including a substrate support, wherein the manifold of the source is oriented with its axis vertical, the substrate support is horizontal and located vertically above the manifold, and the inlet connectors are arranged circumferentially around the lower end of the manifold.

7. An MBE apparatus according to claim 5 wherein the manifold also includes a source and a cracker for gaseous hydride reactants.

8. A method of generating a molecular beam suitable for use in molecular beam epitaxy using an MBE apparatus comprising an MBE chamber and a manifold having (i) an exit port connected to the MBE chamber;
    (ii) a reception zone wherein a plurality of inlet ports are located; and
    (iii) an elongate zone situated between the reception zone and the exit port and being sufficiently long to collimate said beam;

admitting, at pre-set feed rates, a plurality of reagents into said reception zone; the reagents being admitted by way of said plurality of inlet ports;

said reagents being admitted while said MBE chamber and said manifold are exposed to MBE vacuum, delivering a collimated beam at an epitaxial substrate contained in said MBE chamber.

9. A method according to claim 8 further including the step of:

providing said elongate zone with a length L and a volume V such that $L^3/V$ is greater than 10.

10. An MBE apparatus comprising an MBE reaction chamber and a collimating manifold adapted to supply a collimated beam to said MBE reaction chamber, said apparatus having means for evacuating said chamber and said manifold to MBE vacuum, wherein said collimating manifold comprises:

(i) an exit port connected to said MBE reaction chamber;
    (ii) a reception zone which is connected to supply means adapted to provide reagents for admission to the reception zone; and
    (iii) an elongate collimation zone connected at one end to said exit port and at its other end to said reception zone, the length of said collimation zone being sufficient to collimate a molecular beam and provide a substantially uniform composition across a substrate within said MBE reaction chamber.

11. An MBE apparatus according to claim 10, wherein each of said supply means include vent/run valves whereby each reagent is connectable to the reception zone for growth and connectable to a vent before and after growth.

12. An MBE apparatus according to claim 10 or claim 11, wherein said apparatus further includes a secondary manifold for providing additional reagents into the MBE reaction chamber.

13. An MBE apparatus according to claim 12, wherein the secondary manifold is located concentrically inside the collimating manifold.

14. An MBE apparatus according to claim 12, wherein a thermal cracker is located at the outlet of the secondary manifold.

15. An MBE apparatus according to claim 13 wherein a thermal cracker is located at the outlet of the secondary manifold.

16. An MBE apparatus according to claim 10 wherein said elongate collimation zone has a length L and volume V with $L^3/V$ being greater than 10.

* * * * *